(12) United States Patent
Kung et al.

(10) Patent No.: US 8,302,298 B2
(45) Date of Patent: Nov. 6, 2012

(54) PROCESS FOR FABRICATING CIRCUIT SUBSTRATE

(75) Inventors: Chen-Yueh Kung, Taipei Hsien (TW); Wei-Cheng Chen, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 255 days.

(21) Appl. No.: 12/835,085

(22) Filed: Jul. 13, 2010

(65) Prior Publication Data

US 2011/0108315 A1    May 12, 2011

Related U.S. Application Data

(60) Provisional application No. 61/315,408, filed on Mar. 19, 2010.

(30) Foreign Application Priority Data

Nov. 6, 2009 (TW) ................. 98137833 A
May 21, 2010 (TW) ................. 99116309 A

(51) Int. Cl.
*H01K 3/10* (2006.01)

(52) U.S. Cl. ................. 29/852; 29/825; 29/829; 29/846; 216/13; 216/17

(58) Field of Classification Search ............ 29/852, 29/825, 829, 846, 874; 174/255, 260–262, 174/264; 216/13, 17
See application file for complete search history.

(56) References Cited

U.S. PATENT DOCUMENTS

| | | | | |
|---|---|---|---|---|
| 6,326,561 | B1 * | 12/2001 | Watanabe et al. | 174/264 |
| 6,977,348 | B2 * | 12/2005 | Ho et al. | 174/255 |
| 2011/0108313 | A1 | 5/2011 | Kung | |
| 2012/0018207 | A1 | 1/2012 | Kung | |

FOREIGN PATENT DOCUMENTS

| | | |
|---|---|---|
| CN | 2755906 | 2/2006 |
| CN | 1980531 | 6/2007 |
| CN | 101702400 | 5/2010 |

OTHER PUBLICATIONS

"1st Office Action of China Counterpart Application", issued on Jun. 24, 2011, p. 1-p. 4, in which the listed reference was cited.

* cited by examiner

*Primary Examiner* — Thiem Phan
(74) *Attorney, Agent, or Firm* — J.C. Patents

(57) ABSTRACT

A process for fabricating a circuit substrate is provided. A patterned conductive layer having an inner pad is provided on a base layer, a dielectric layer is disposed on the base layer and covers the patterned conductive layer, and a covering layer is disposed on the dielectric layer. A part of the covering layer is removed by dry etching to form a first opening. A part of the dielectric layer exposed by the first opening is removed to form a dielectric opening exposing a part of the inner pad. A patterned mask having a second opening to expose a part of the inner pad is formed on the covering layer. A conductive structure including a conductive block filling the dielectric opening, an outer pad filling the first opening and a surplus layer filling the second opening is formed. Finally, the patterned mask, surplus layer and covering layer are removed.

10 Claims, 9 Drawing Sheets

PROCESS FOR FABRICATING CIRCUIT SUBSTRATE

CROSS-REFERENCE TO RELATED APPLICATION

This application claims the priority benefit of U.S. provisional application Ser. No. 61/315,408, filed on Mar. 19, 2010. This application also claims the priority benefits of Taiwan application serial no. 99116309, filed on May 21, 2010 and Taiwan application serial no. 98137833, filed on Nov. 6, 2009. The entirety of each of the above-mentioned patent applications is hereby incorporated by reference herein and made a part of this specification.

BACKGROUND OF THE INVENTION

1. Field of the Invention

The present invention relates to a circuit substrate and fabricating method thereof. More particularly, the present invention relates to a circuit substrate with a pad and a conductive block formed in one piece with each other and the fabricating method thereof.

2. Description of Related Art

In current semiconductor package technology, a circuit substrate is one of the most frequently used components. A conventional circuit substrate is mainly composed of a plurality of patterned conductive layers and a plurality of dielectric layers alternately stacked to one another. In addition, the patterned conductive layers are electrically connected through a plurality of conductive vias. As the integration of traces in the circuit substrate increases, how to utilize the limited space of circuit substrate effectively in circuit layout has become an important subject.

SUMMARY OF THE INVENTION

The present invention provides a method comprising following steps for fabricating a circuit substrate. A base layer, a patterned conductive layer, a dielectric layer and a covering layer are provided, wherein the patterned conductive layer having an inner pad is disposed on the base layer, the dielectric layer is disposed on the base layer and covers the patterned conductive layer, and the covering layer is disposed on the dielectric layer. A part of the covering layer is removed by dry etching to form a first opening. A part of the dielectric layer exposed by the first opening is removed to form a dielectric opening exposing a part of the inner pad. A patterned mask having a second opening to expose a part of the inner pad is formed on the covering layer. A conductive structure including a conductive block filling the dielectric opening, an outer pad filling the first opening and a surplus layer filling the second layer is provided, wherein the conductive block, the outer pad and the surplus layer are formed in one piece together. Then, the patterned mask, the surplus layer and the covering layer are removed.

The present invention further provides a circuit substrate including a base layer, a patterned conductive layer, a dielectric layer and a conductive block. The patterned conductive layer having an inner pad is disposed on the base layer. The dielectric layer is disposed on the base layer and the dielectric layer covers the patterned conductive layer. The conductive block penetrates the dielectric layer, and the conductive block is substantially coplanar with the dielectric layer and connected the inner pad.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
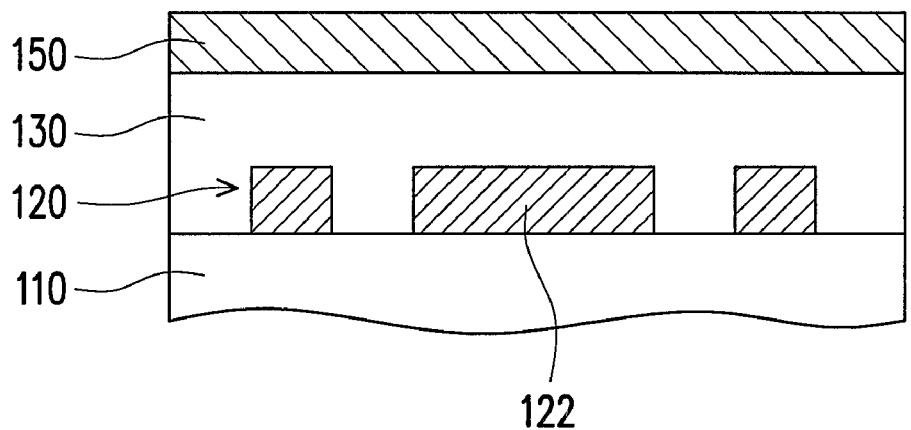
FIGS. 1A through 1I are cross-sectional views showing a process of fabricating a circuit substrate according to an embodiment of the present invention.

FIGS. 1A through 1I are cross-sectional views showing a process of fabricating a circuit substrate according to an embodiment of the present invention. First, as shown in FIG. 1A, a base layer 110, a patterned conductive layer 120, a dielectric layer 130 and a covering layer 150 are provided. The base layer 110 may be a circuit layer of a chip, a circuit layer of a chip carrier, or a circuit layer of a printed circuit board. The patterned conductive layer 120 is disposed in the base layer 110 and the patterned conductive layer 120 has an inner pad 122. The dielectric layer 130 is disposed on the base layer 110 and the dielectric layer 130 covers the patterned conductive layer 120. The covering layer 150 is disposed on the dielectric layer 130. The material of the covering layer 150 may be nonmetal such as organic material or may be metal used as a barrier. Particularly, in an embodiment, the covering layer 150 is made of the material capable of being peeled from the dielectric layer 130.

In the present embodiment, the dielectric layer 130 can be made of resin, and the dielectric layer 130 and the covering layer 150 thereon are laminated with the base layer 110 and the patterned conductive layer 120, such that the dielectric layer 130 is located between the base layer 110 and the covering layer 150 and covers the patterned conductive layer 120. In other words, in the present embodiment, a double layered structure comprising the dielectric layer 130 and the covering layer 150 is provided and laminated with the base layer 110 and the patterned conductive layer 120 thereon. For the fabrication process of the present invention, the double layered structure including the dielectric layer 130 and the covering layer 150 facilitates simplifying the fabricating process. In another embodiment, the dielectric layer 130 and the covering layer 150 can be formed on the base layer 110 in sequence to cover the patterned conductive layer 120.

Figure 1B:
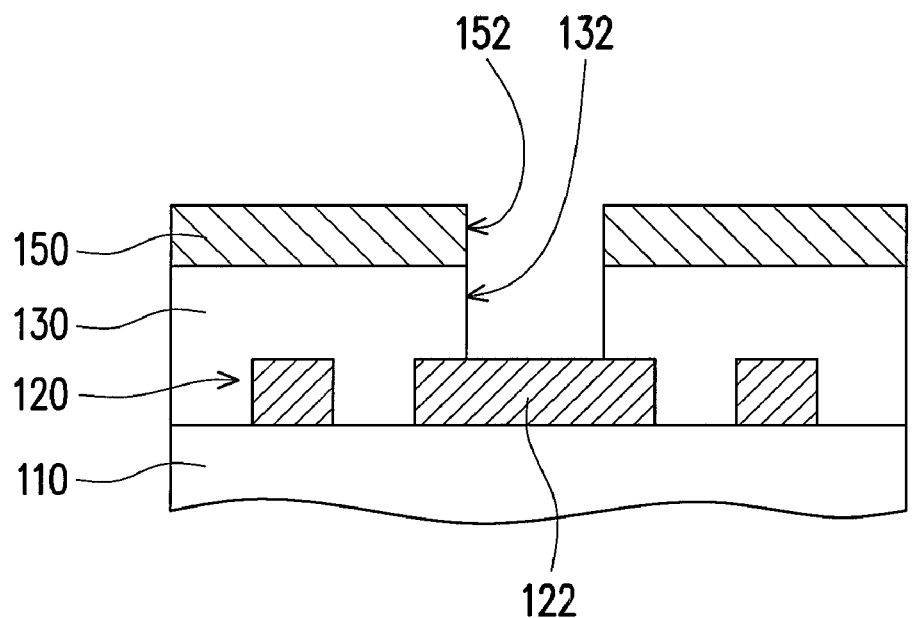

Referring to FIG. 1B, a part of the covering layer 150 is removed by dry etching to form a first opening 152. In the present embodiment, the material of the covering layer 150 is nonmetal, and the dry etching for removing the part of the covering layer 150 may be laser ablation or plasma etching. In another embodiment, if the material of the covering layer 150 is metal, patterning process including photolithography and etching is adopted to faun the first opening 152 rather than laser ablation. Comparing with the patterning process, the dry etching (especially laser ablation) requires less processing time in forming the first opening 152.

Then, referring to FIG. 1B again, a part of the dielectric layer 130 exposed by the first opening 152 is removed to form a dielectric opening 132, wherein the dielectric opening 132 exposes a part of the inner pad 122.

In the present embodiment, if the material of the covering layer 150 is nonmetal, the part of the dielectric layer 130 exposed by the first opening 152 can be removed by dry etching. The dry etching used for removing a portion of the dielectric layer 130 is, for example, laser ablation or plasma etching.

Figure 1C:
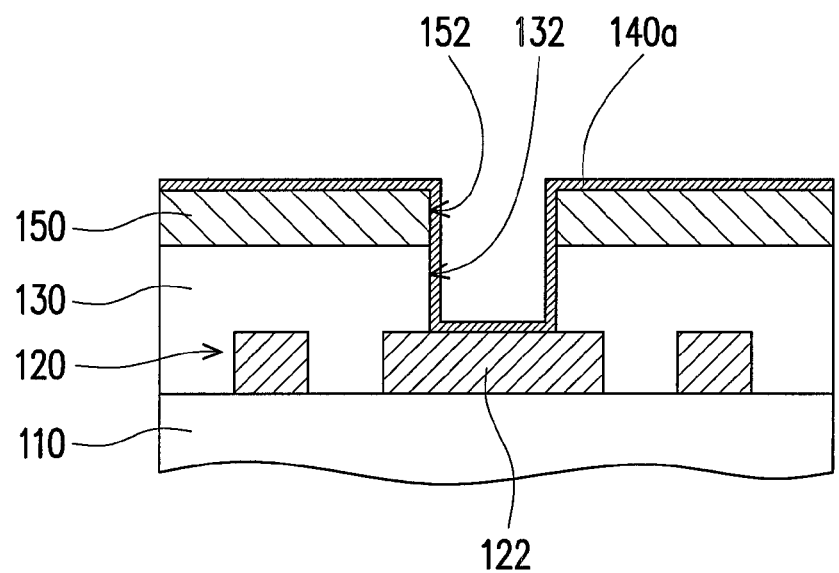

Referring to FIG. 1C, a conductive seed layer 140a is formed on the inner wall of the dielectric opening 132, the inner wall of the first opening 152, and the covering layer 150. The material of the conductive seed layer 140a is copper, for example.

Figure 1D:
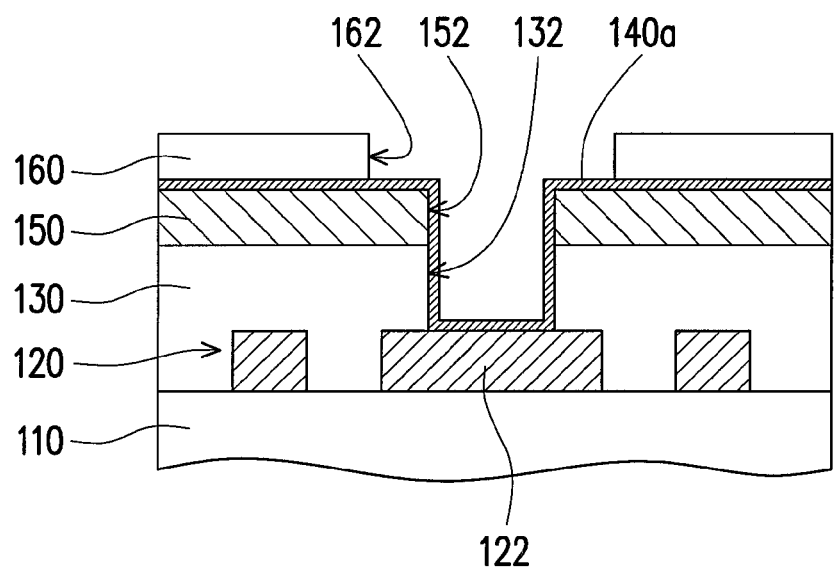

Referring to FIG. 1D, a patterned mask 160 having a second opening 162 to expose the first opening 152, the dielectric opening 132 and a part of the inner pad 122 is formed on a part of the conductive seed layer 140a located on the covering layer 150.

Figure 1E:
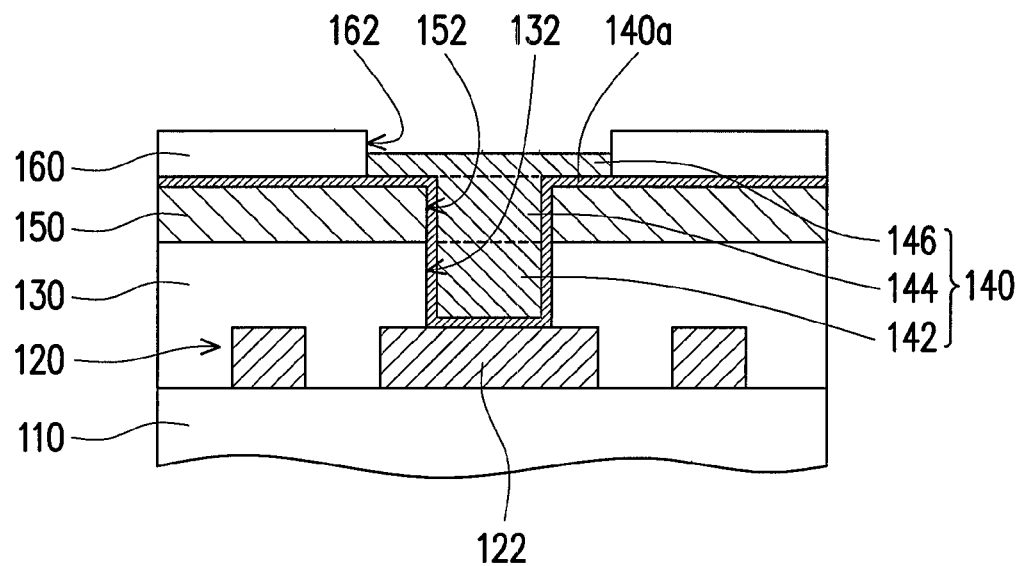

Next, referring to FIG. 1E, a conductive structure 140 is formed by plating in using the conductive seed layer 140a for transmitting current. The material of the conductive structure 140 is copper, for example. The conductive structure 140 includes a conductive block 142 filling the dielectric opening 132 and covering a part of the inner pad 122, an outer pad 144 filling the first opening 152, and a surplus layer 146 filling the second opening 162. The conductive block 142, the outer pad 144 and the surplus layer 146 are formed by plating to provide an integrative structure.

Figure 1F:
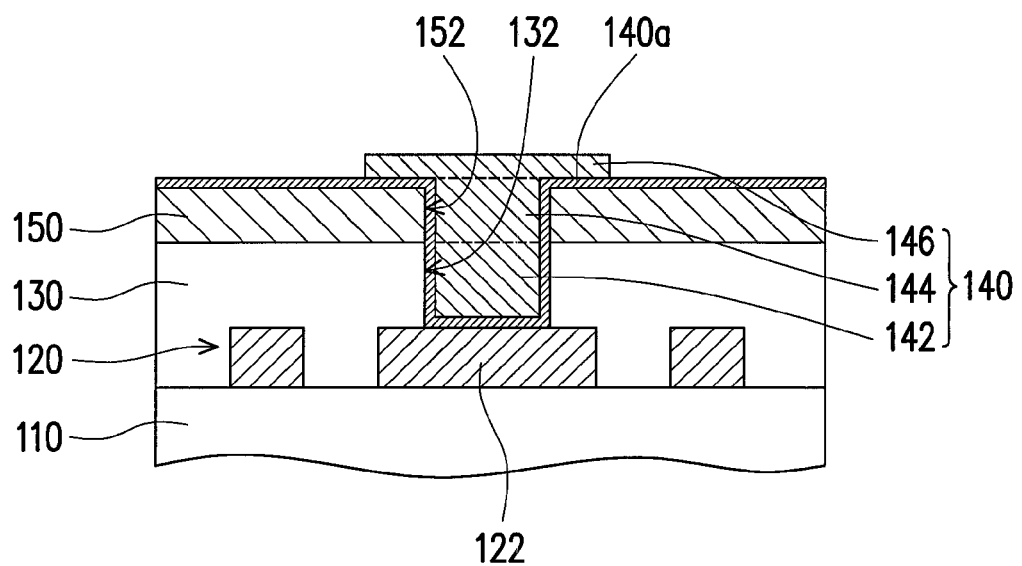

Then, referring to FIG. 1F, the patterned mask 160 is removed.

Figure 1G:
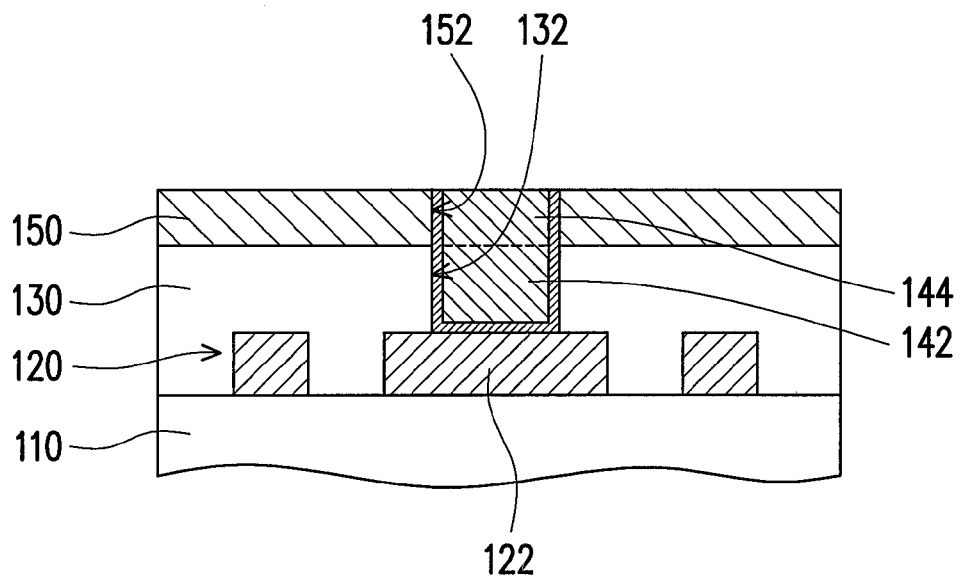

Referring to FIG. 1G, the surplus layer 146 and the part of the conductive seed layer 140a located on the covering layer 150 are removed. In the present embodiment, the surplus layer 146 and the part of the conductive seed layer 140a located on the covering layer 150 can be removed by grinding, polishing or etching.

Figure 1H:
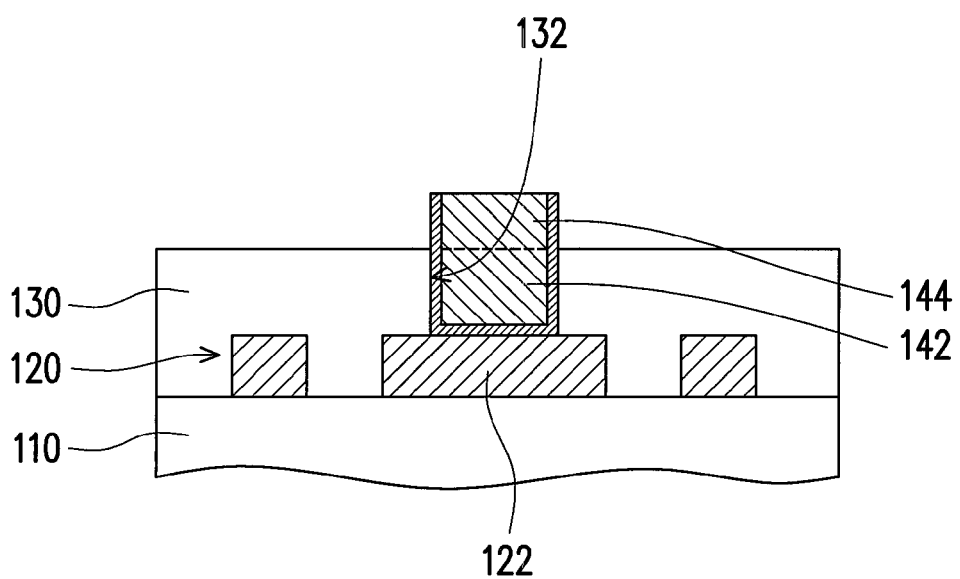

Referring to FIG. 1H, the covering layer 150 is removed. In the present embodiment, the covering layer 150 can be peeled from the dielectric layer 130 after weakening the bonding between the covering layer 150 and the dielectric layer 130. It is noted that the outer pad 144 is exposed after removing the covering layer 150 to be connected with a chip or a package. In addition, the thickness of the outer pad 144 is related to the covering layer 150; namely, the thickness of the outer pad 144 can be controlled by adjusting the thickness of the covering layer 150.

Figure 1I:
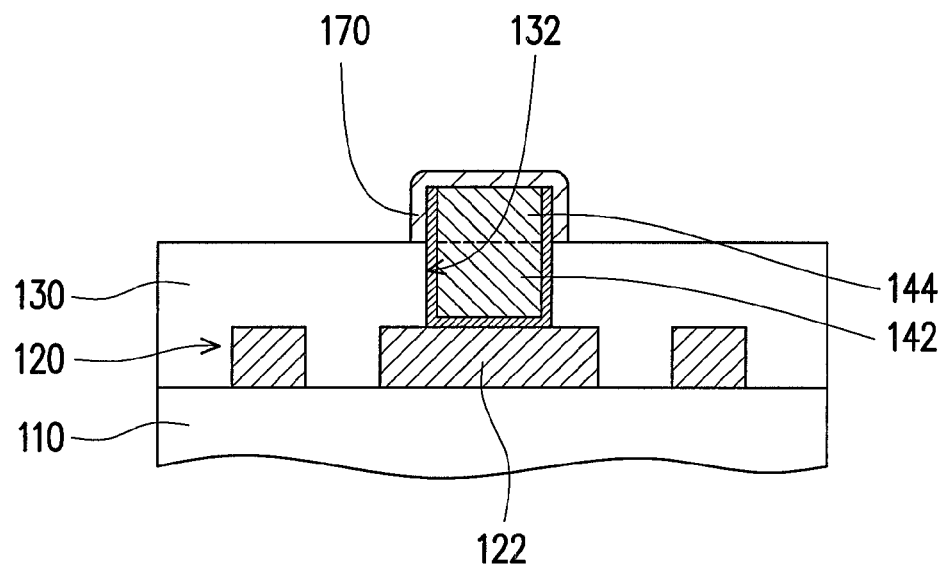

Referring to FIG. 1I, a surface passivation layer 170 may further be formed on the outer pad 144 and a part of the conductive seed layer 140a. The material of the surface passivation layer 170 may comprises Ni/Au stacked layer, Ni/Pd/Au stacked layer, Ni/Sn stacked layer, Pd, Au or the alloy thereof, or the surface passivation layer 170 may be an organic solderability preservation (OSP).

Figure 2:
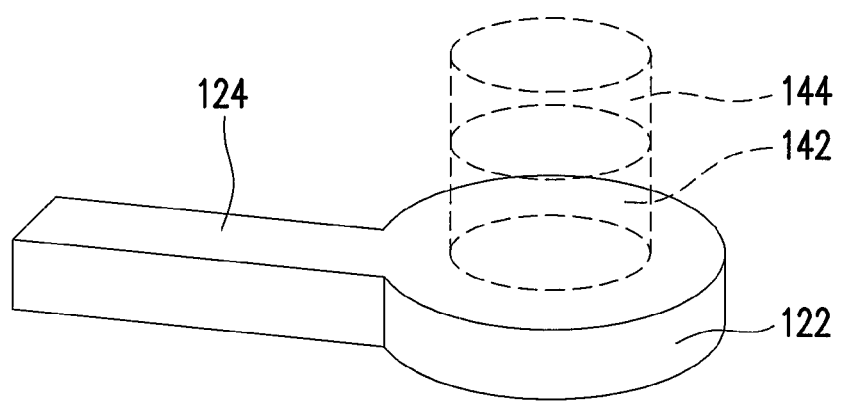
FIG. 2 is a perspective view showing the inner pad and the conductive block of FIG. 1.

FIG. 2 is a perspective view showing the inner pad and the conductive block of FIG. 1. Referring to FIGS. 1I and 2, the outer diameter of the inner pad 122 is greater than that of the conductive block 142. In addition, the patterned conductive layer 120 further has an inner trace 124, wherein the inner pad 122 is formed of an end portion of the inner trace 124, and the outer diameter of the inner pad 122 is greater than a line width of the inner trace 124. In the present embodiment, the inner trace 124 may be served as a signal trace, a grounding trace or a power trace.

Figure 3:
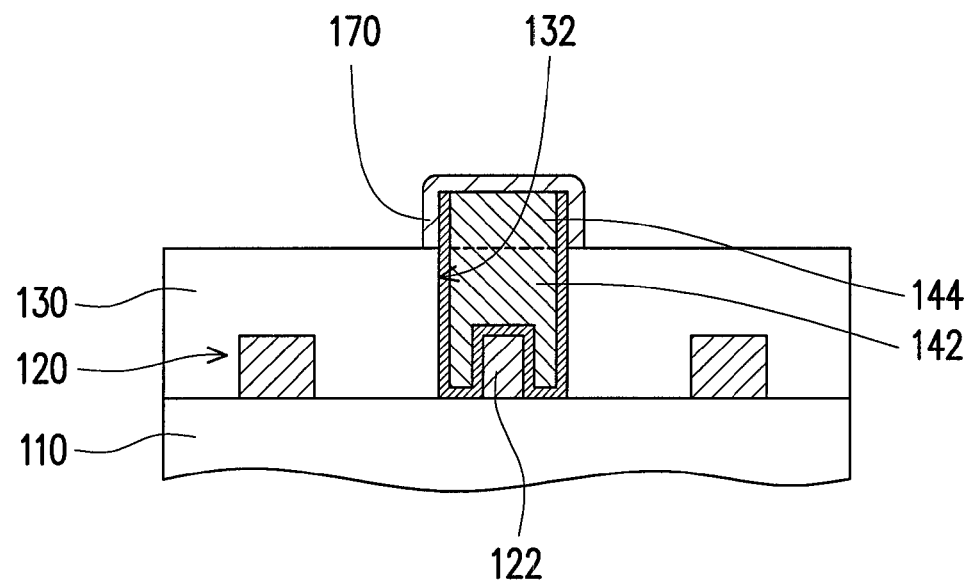
FIG. 3 is a cross-sectional view showing a final step of a process of fabricating a circuit substrate according to another embodiment of the present invention.
Figure 4:
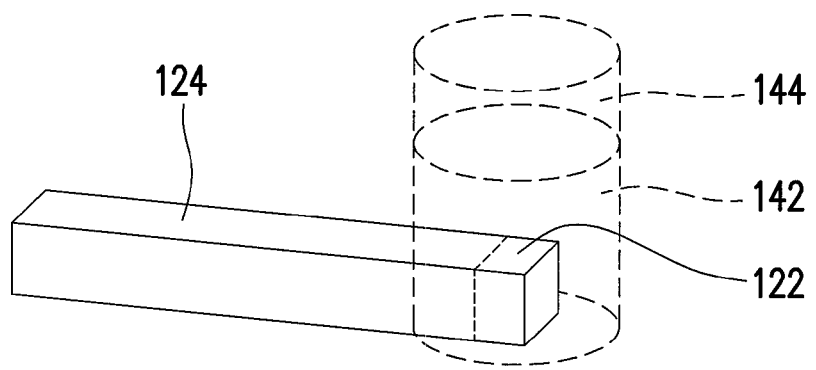
FIG. 4 is a perspective view showing the inner pad and the conductive block of FIG. 3.

FIG. 3 is a cross-sectional view showing a final step of a process of fabricating a circuit substrate according to another embodiment of the present invention. FIG. 4 is a perspective view showing the inner pad and the conductive block of FIG. 3. Referring to FIGS. 3 and 4, the present embodiment is similar to the above embodiment shown in FIGS. 1A through 1I except that an outer diameter of the inner pad 122 is smaller than an outer diameter of the conductive block 142 such that the conductive block 142 encompasses the inner pad 122. In addition, the patterned conductive layer 120 further has an inner trace 124, wherein the inner pad 122 is formed of an end portion of the inner trace 124, and the outer diameter of the inner pad 122 is substantially equal to a line width of the inner trace 124.

Figure 5A:
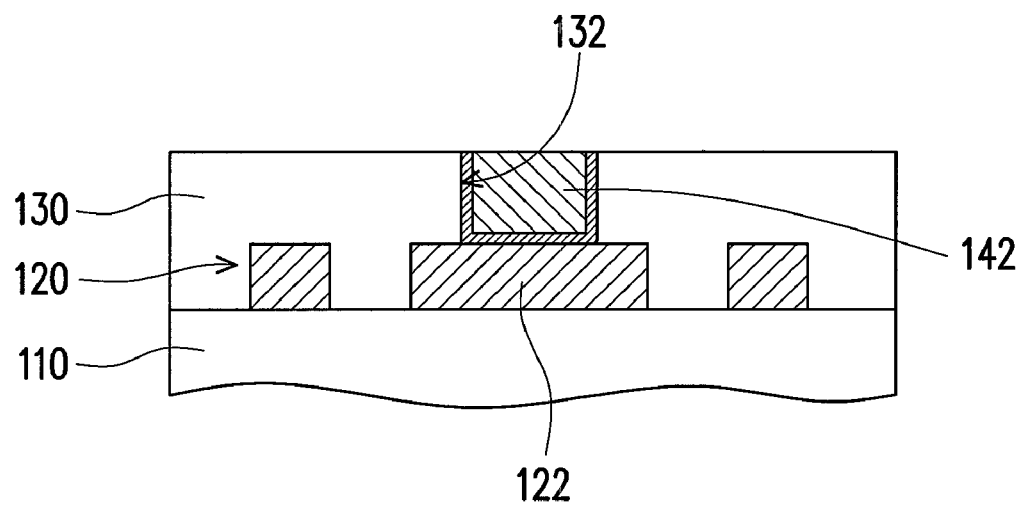
FIGS. 5A and 5B are cross-sectional views showing final two steps of a process of fabricating a circuit substrate according to another embodiment of the present invention.
Figure 5B:
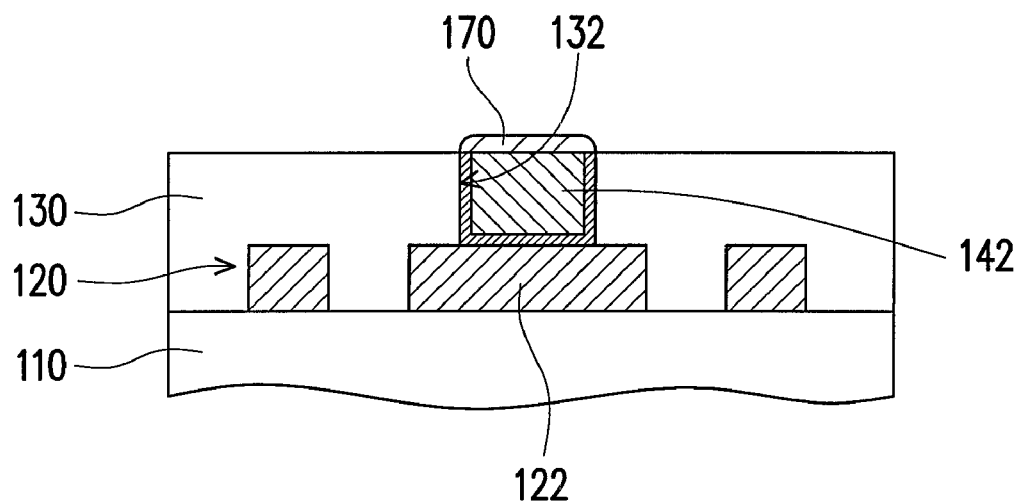

FIGS. 5A and 5B are cross-sectional views showing final two steps of a process of fabricating a circuit substrate according to another embodiment of the present invention. Referring to FIG. 5A, following the steps as shown in FIGS. 1A through 1H, the outer pad 144 and a part of the conductive seed layer 140a are removed such that the conductive block 142 is substantially coplanar with the dielectric layer 130 and connected with a part of the inner pad 122 via the conductive seed layer 140a. Referring to FIG. 5B, finally, a surface passivation layer 170 may be formed on the outer pad 142 and a part of the conductive seed layer 140a.

Figure 6:
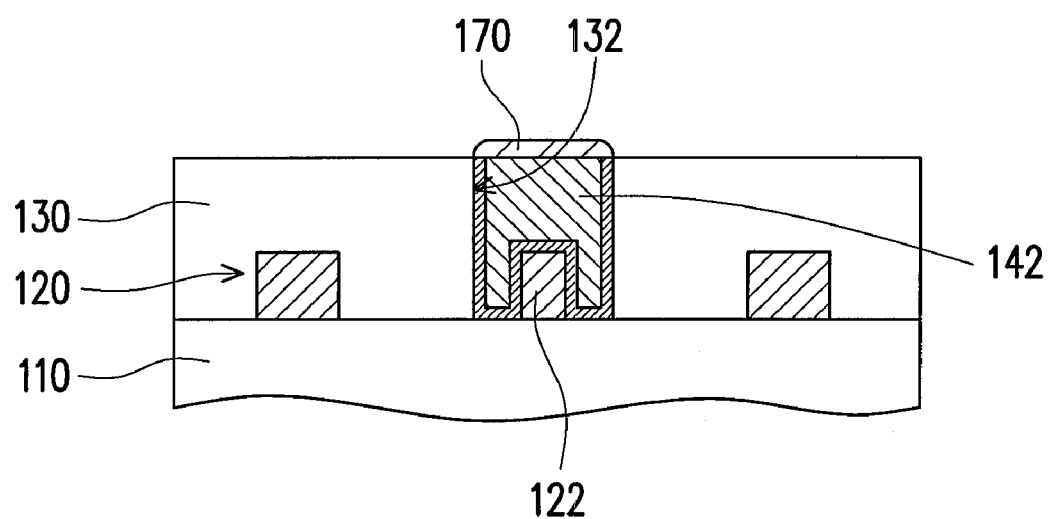
FIG. 6 is a cross-sectional view showing a final step of a process of fabricating a circuit substrate according to another embodiment of the present invention.

FIG. 6 is a cross-sectional view showing a final step of a process of fabricating a circuit substrate according to another embodiment of the present invention. Referring to FIG. 6, the present embodiment is similar to the above embodiment shown in FIG. 5B except that an outer diameter of the inner pad 122 is smaller than an outer diameter of the conductive block 142 such that the conductive block 142 encompasses the inner pad 122. FIG. 4 shows the same concept.

Figure 7:
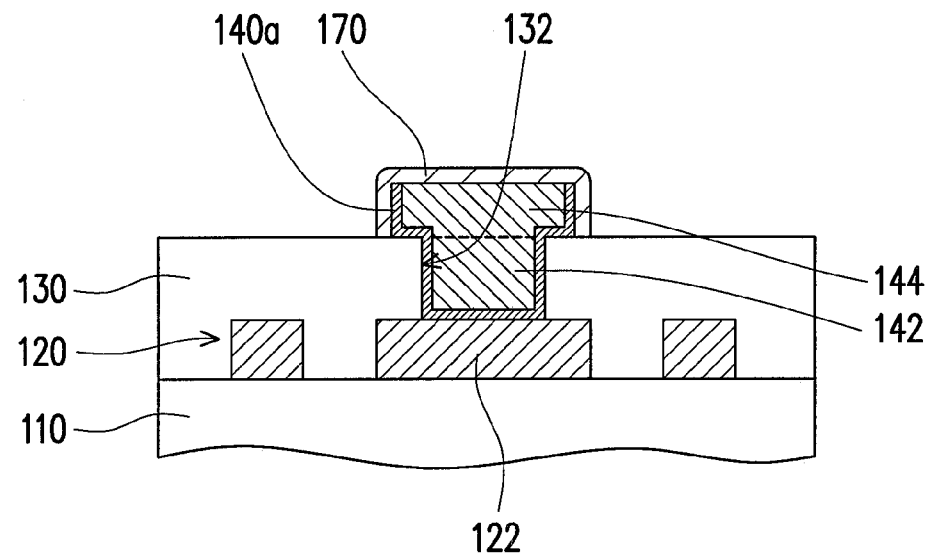
FIG. 7 is a cross-sectional view showing a final step of a process of fabricating a circuit substrate according to another embodiment of the present invention.

FIG. 7 is a cross-sectional view showing a final step of a process of fabricating a circuit substrate according to another embodiment of the present invention. Being different from the aforementioned embodiment of FIG. 1I, the present embodiment increases the inner diameter of the first opening 152 by performing another etching process to broaden the first opening 152 after forming the first opening 152 and the dielectric opening 132 in FIG. 1B, such that the outer diameter of the outer pad 144 later formed in FIGS. 1C through 1E is greater than that of the conductive block 142.

Figure 8:
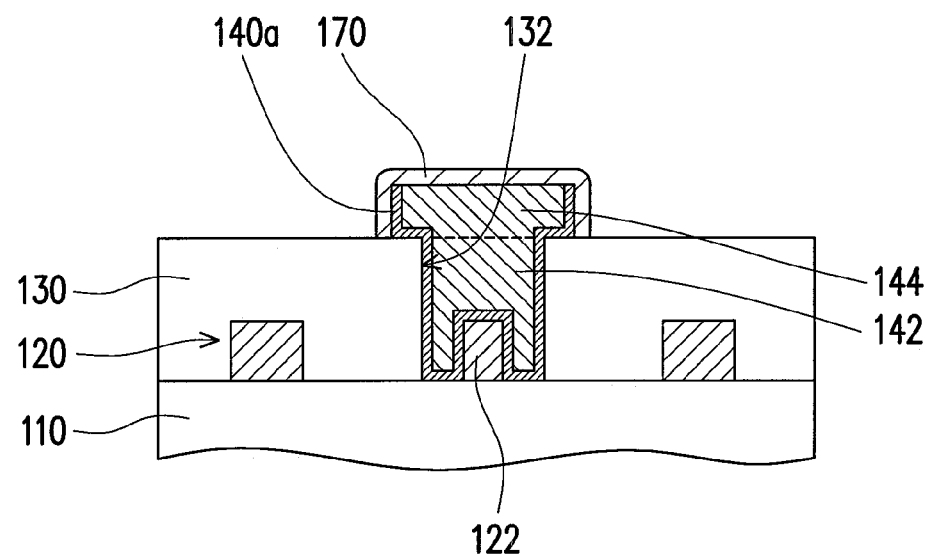
FIG. 8 is a cross-sectional view showing a final step of a process of fabricating a circuit substrate according to another embodiment of the present invention.

FIG. 8 is a cross-sectional view showing a final step of a process of fabricating a circuit substrate according to another embodiment of the present invention. Referring to FIG. 8, the present embodiment is similar to the above embodiment shown in FIG. 7 except that an outer diameter of the inner pad 122 is smaller than an outer diameter of the conductive block 142 such that the conductive block 142 encompasses the inner pad 122. FIG. 4 shows the same concept.

In summary, the present invention forms an opening in the covering layer by dry etching so as to reduce the processing time and facilitate the formation of the outer pad. In addition, the thickness of the outer pad can be precisely controlled through the covering layer. The conductive block and the outer pad are formed in one piece, such that misalignment between the outer pad and the conductive block during plural patterning steps of the conventional process can be prevented. Furthermore, the conductive block embedded in the dielectric layer can replace the outer pad to serve as an electrode of the circuit substrate.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for fabricating a circuit substrate, comprising:
   providing a base layer, a patterned conductive layer, a dielectric layer and a covering layer, wherein the patterned conductive layer having an inner pad is disposed on the base layer, the dielectric layer is disposed on the base layer and covers the patterned conductive layer, and the covering layer is disposed on the dielectric layer;
   removing a part of the covering layer by dry etching to form a first opening;
   removing a part of the dielectric layer exposed by the first opening to form a dielectric opening exposing a part of the inner pad;
   forming a patterned mask on the covering layer, wherein the patterned mask has a second opening to expose a part of the inner pad is formed on the covering layer;
   forming a conductive structure including a conductive block filling the dielectric opening, an outer pad filling the first opening and a surplus layer filling the second opening, wherein the conductive block, the outer pad and the surplus layer are formed in one piece together; and
   removing the patterned mask, the surplus layer and the covering layer.

2. The method as claimed in claim 1, wherein the material of the covering layer is nonmetal, and the dry etching for removing the part of the covering layer comprises laser ablation or plasma etching.

3. The method as claimed in claim 1, wherein a method of removing the parts of the dielectric layer exposed by the first opening comprises dry etching.

4. The method as claimed in claim 3, wherein the material of the dielectric layer is nonmetal, and the dry etching for removing the part of the dielectric layer comprises laser ablation or plasma etching.

5. The method as claimed in claim 1, wherein the method of providing the base layer, the patterned conductive layer, the dielectric layer and the covering layer comprises:
   providing a double layered structure including the dielectric layer and the covering layer;
   providing the base layer with the patterned conductive layer thereon; and
   laminating the double layered structure with the base layer and the patterned conductive layer.

6. The method as claimed in claim 1, further comprising:
   forming a conductive seed layer on the inner pad, an inner wall of the dielectric opening, an inner wall of the first opening and the covering layer before forming the patterned mask, wherein the patterned mask is formed on a part of the conductive seed layer located on the covering layer, and the conductive structure is formed by plating in using the conductive seed layer for transmitting current; and
   removing the part of the conductive seed layer located on the covering layer after removing the patterned mask.

7. The method as claimed in claim 1, wherein the step of removing the covering layer comprises:
   weakening the bonding between the covering layer and the dielectric layer; and
   peeling the covering layer from the dielectric layer.

8. The method as claimed in claim 1, wherein a thickness of the outer pad depends on a thickness of the covering layer.

9. The method as claimed in claim 1, further comprising:
   removing the outer pad after removing the surplus layer.

10. The method as claimed in claim 9, further comprising:
    forming a surface passivation layer on the conductive block after removing the outer pad.

* * * * *